US008853024B2

(12) United States Patent
Yin et al.

(10) Patent No.: US 8,853,024 B2
(45) Date of Patent: Oct. 7, 2014

(54) METHOD OF MANUFACTURING SEMICONDUCTOR DEVICE

(75) Inventors: Huaxiang Yin, Beijing (CN); Jiang Yan, New Burgh, NY (US); Dapeng Chen, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/812,498

(22) PCT Filed: Aug. 27, 2012

(86) PCT No.: PCT/CN2012/001153
§ 371 (c)(1),
(2), (4) Date: Jan. 26, 2013

(87) PCT Pub. No.: WO2014/015449
PCT Pub. Date: Jan. 30, 2014

(65) Prior Publication Data
US 2014/0027857 A1 Jan. 30, 2014

(30) Foreign Application Priority Data

Jul. 24, 2012 (CN) .......................... 2012 1 0258854

(51) Int. Cl.
*H01L 21/8238* (2006.01)
(52) U.S. Cl.
USPC ............ 438/199; 438/202; 438/205; 257/369
(58) Field of Classification Search
USPC ......... 438/199, 216, 275, 287, 303, 424, 591, 438/754; 257/194, 330–331, 368–369, 412, 257/351
See application file for complete search history.

(56) References Cited

U.S. PATENT DOCUMENTS

| 2010/0052066 | A1 | 3/2010 | Yu et al. | |
|---|---|---|---|---|
| 2011/0147831 | A1 | 6/2011 | Steigerwald | |
| 2012/0068261 | A1 | 3/2012 | Kwon et al. | |
| 2013/0062701 | A1* | 3/2013 | Lee et al. | 257/369 |
| 2013/0082332 | A1* | 4/2013 | Liu et al. | 257/369 |
| 2013/0130460 | A1* | 5/2013 | Liao et al. | 438/299 |
| 2013/0161754 | A1* | 6/2013 | Su et al. | 257/369 |

FOREIGN PATENT DOCUMENTS

| CN | 102024813 A | 2/2012 |
|---|---|---|
| CN | 102339855 A | 2/2012 |

* cited by examiner

Primary Examiner — Dung A. Le
(74) Attorney, Agent, or Firm — Treasure IP Group

(57) ABSTRACT

The present invention discloses a method for manufacturing a semiconductor device comprising the steps of: forming a plurality of source and drain regions in a substrate; forming a plurality of gate spacer structures and an interlayer dielectric layer around the gate spacer structures on the substrate, wherein the gate spacer structures enclose a plurality of first gate trenches and a plurality of second gate trenches; sequentially depositing a first gate insulating layer and a second gate insulating layer, a first blocking layer and a second work function regulating layer in the first and second gate trenches; performing selective etching to remove the second work function regulating layer from the first gate trenches to expose the first blocking layer; depositing a first work function regulating layer on the first blocking layer in the first gate trenches and on the second work function regulating layer in the second gate trenches; and depositing a resistance regulating layer on the first work function regulating layer in the first gate trenches and on the first work function regulating layer in the second gate trench.

7 Claims, 2 Drawing Sheets

METHOD OF MANUFACTURING SEMICONDUCTOR DEVICE

CROSS REFERENCE

This application is a National Phase application of, and claims priority to, PCT Application No. PCT/CN2012/001153, filed on Aug. 27, 2012, entitled 'SEMICONDUCTOR DEVICE AND METHOD OF MANUFACTURING THE SAME', which claimed priority to Chinese Application No. CN 201210258854.0, filed on Jul. 24, 2012. Both the PCT Application and Chinese Application are incorporated herein by reference in their entireties.

FIELD OF THE INVENTION

The present invention relates to a semiconductor device and a method of manufacturing the same, more particularly, to a CMOS that is capable of more effectively controlling the work function and decreasing the gate resistance and a method of manufacturing the same.

BACKGROUND OF THE INVENTION

Starting from the 45 nm CMOS integrated circuit technology, with continuous reduction in the device feature size, the equivalent oxide thickness (EOT) of a gate insulating dielectric layer in a CMOS device must be reduced synchronously to suppress the short channel effect. However, the ultra-thin (e.g., 10 nm) conventional oxide layer or oxynitride layer may result in severe gate current leakage since the (relative) dielectric constant is not high (e.g., about 3.9) and the insulating capability can hardly endure the relatively high field strength in such an ultra-small device. Hence, a conventional polysilicon/SiON system is no longer applicable.

In view of this, high-K (HK) dielectric materials are started to be used to manufacture a gate insulating dielectric layer in the industry. However, the interfacial charges and polarization charges of high-K materials will cause difficulty in regulating the threshold of a device, and the combination of polysilicon and high-K materials will produce a Fermi-level pinning effect, thus such combination of polysilicon and high-K materials can not be used for regulating the threshold of a MOSFET, accordingly, the gate electrode shall employ different metal materials to regulate the threshold of a device, that is, using a metal gate (MG)/HK structure.

Metal electrodes of different work functions are needed for regulating the threshold of different MOSFETs, e.g., an NMOS and a PMOS. The regulation method using a single metal gate material may be adopted, but the range of regulation is limited. In an example of a planar SOI multi-gate device with lower standby power employing a single metal gate material, to correspond to a work function of 4.1 eV of n+ polysilicon and a work function of 5.2 eV of p+ polysilicon, an appropriate metal electrode may be selected such that the work function of the gate can be in the vicinity of the median value of the two, e.g., to be 4.65 eV or 4.65±0.3 eV. However, the device threshold is hard to be effectively controlled by such a fine regulation within a small range. The optimal process is to adopt gate electrodes of different metal materials, for example, conduction-band metal is used for the NMOS and valence-band metal is used for the PMOS such that the gate work functions of the NMOS and the PMOS can be located at the edges of the conduction band and the valence band, respectively, e.g., 4.1±0.1 eV and 5.2±0.1 eV, respectively. A detailed study of selection of the materials for these gate metal (including metal nitride) has been made in the industry, and no more unnecessary details will be provided here.

Generally, the existing CMOS dual-metal gate integration process comprises: performing etching to remove the dummy gate from the PMOS and NMOS basic structures to thereby form a PMOS gate trench and a NMOS gate trench, and depositing a gate insulating layer of high-K materials in the two gate trenches; sequentially depositing a first blocking layer such as TiN (and/or an etch stop layer, such as Ta and TaN), a PMOS work function regulating layer (such as TiN), and a second blocking layer (such as TaN) on the gate insulating layer in the PMOS gate trench and the NMOS gate trench; performing selective dry etching to remove the PMOS work function regulating layer and the second blocking layer from the NMOS region, exposing and stopping at the first blocking layer; depositing a NMOS work function regulating layer (such as TiAl and Al) on the second blocking layer of the PMOS region and the first blocking layer exposed at the NMOS region; sequentially depositing a third blocking layer (such as TiN and Ti) and a resistance regulating layer on the entire device, i.e., the NMOS work function regulating layer; performing chemical mechanical polishing (CMP) planarization to expose an interlayer dielectric (ILD) layer; and performing etching to the ILD to form source and drain contact holes and filling metal to form source and drain contact plugs.

The above existing technology facilitates the Al ions contained in the NMOS work function regulating layer to diffuse quickly, so that they may effectively diffuse to the vicinity of the interface between the gate insulating layer and the first blocking layer, to thereby control the NMOS work function effectively. However, in order to avoid the effect of the Al ions in the NMOS work function regulating layer on the PMOS work function regulating layer, a second blocking layer must be formed and retained in the PMOS region. Thus, in the device structure of the PMOS region, the metal gate structure is extremely complex (comprising three blocking layers), in a condition where the feature size-the gate length is continuously reduced, particularly when the gate length is below 22 nm, since the structure of the multi-layer blocking layer causes a decrease in the space of the resistance regulating layer of the PMOS region which can be filled, problems will occur where the gate resistance is difficult to be effectively reduced due to small size of the resistance regulating layer and the resistivity is increased due to holes formed by insufficient filling.

SUMMARY OF THE INVENTION

As stated above, the present invention aims to overcome the above problem, to thereby control the metal gate work function effectively while decreasing the gate resistance efficiently.

Therefore, the present invention provides a semiconductor device, comprising a substrate, a plurality of gate stack structures on the substrate, a plurality of gate spacer structures on both sides of each gate stack structure, a plurality of source and drain regions in the substrate on both sides of each gate spacer structure, the plurality of gate stack structures comprising a plurality of first gate stack structures and a plurality of second gate stack structures, characterized in that each of the first gate stack structures comprises a first gate insulating layer, a first blocking layer, a first work function regulating layer and a resistance regulating layer, and each of the second gate stack structures comprises a second gate insulating layer, a first blocking layer, a second work function regulating layer, a first work function regulating layer and a resistance regulating layer.

Wherein the first and/or the second gate insulating layer comprises one of silicon oxide, nitrogen-doped silicon oxide, silicon nitride and high-K materials, or combinations thereof.

Wherein the high-K materials include Hf-based materials selected from a group consisting of $HfO_2$, $HfSiO_x$, HfSiON, $HfAlO_x$, $HfTaO_x$, $HfLaO_x$, $HfAlSiO_x$, and $HfLaSiO_x$, rare-earth based high-K dielectric materials selected from a group consisting of $ZrO_2$, $La_2O_3$, $LaAlO_3$, $TiO_2$ and $Y_2O_3$, $Al_2O_3$, or a composite layer of the above materials.

Wherein the first blocking layer comprises $M_xN_y$ or $M_xSi_yN_z$, wherein M is a metal selected from Ta, Ti, Hf, Zr, Mo and W, or combinations thereof, whose diffusion rate is slower than that of Al.

Wherein, the second work function regulating layer comprises Al or Al alloy, wherein the Al alloy is an alloy constituted by Al with a metal selected from Co, Ni, Cu, Pd, Pt, Ru, Re, Mo, Ta, Ti, Hf, Zr, W, Ir, Eu, Nd, Er and La, or combinations thereof.

Wherein the first work function regulating layer comprises: a) metal nitride in a form of $M_xN_y$ or $M_xSi_yN_z$, wherein M is one of Ta, Ti, Hf, Zr, Mo, and W, or combinations thereof; and/or b) metal, wherein the metal is one of Co, Ni, Cu, Pd, Pt, Ru, Re, Mo, Ta, Ti, Hf, Zr, W, Ir, Eu, Nd, Er and La, or combinations thereof.

Wherein the resistance regulating layer comprises: a) metal nitride in a form of $M_xN_y$ or $M_xSi_yN_z$, wherein M is one of Ta, Ti, Hf, Zr, Mo, and W, or combinations thereof; b) metal or metal alloy, including one of Co, Ni, Cu, Pd, Pt, Ru, Re, Mo, Ta, Ti, Hf, Zr, W, Ir, Eu, Nd, Er and La, or combinations thereof; c) metal silicide, including one of $CoSi_2$, $TiSi_2$, NiSi, PtSi, NiPtSi, CoGeSi, TiGeSi and NiGeSi, or combinations thereof; d) metal oxide conductor, including one of $In_2O_3$, $SnO_2$, ITO and IZO, or combinations thereof; and e) semiconductor materials, including one of doped polysilicon, amorphous silicon, polycrystalline germanium, and polycrystalline silicon-germanium, or combinations thereof.

The present invention also provides a method for manufacturing a semiconductor device, comprising the steps of: forming a plurality of source and drain regions in a substrate; forming a plurality of gate spacer structures and an interlayer dielectric layer around the gate spacer structures on the substrate, wherein the gate spacer structures enclose a plurality of first gate trenches and a plurality of second gate trenches; sequentially depositing a first gate insulating layer and a second gate insulating layer, a first blocking layer and a second work function regulating layer in the first and second gate trenches; performing selective etching to remove the second work function regulating layer from the first gate trenches to expose the first blocking layer; depositing a first work function regulating layer on the first blocking layer in the first gate trenches and on the second work function regulating layer in the second gate trenches; and depositing a resistance regulating layer on the first work function regulating layer in the first gate trenches and on the first work function regulating layer in the second gate trenches.

Wherein the first and/or the second gate insulating layer comprises one of silicon oxide, nitrogen-doped silicon oxide, silicon nitride, and high-K materials, or combinations thereof.

Wherein the high-K materials include Hf-based materials selected from a group consisting of $HfO_2$, $HfSiO_x$, HfSiON, $HfAlO_x$, $HfTaO_x$, $HfLaO_x$, $HfAlSiO_x$, and $HfLaSiO_x$, rare-earth based high-K dielectric materials selected from a group consisting of $ZrO_2$, $La_2O_3$, $LaAlO_3$, $TiO_2$ and $Y_2O_3$, $Al_2O_3$, or a composite layer of the above materials.

Wherein the first blocking layer comprises $M_xM_y$ or $M_xSi_yN_z$, wherein M is a metal selected from Ta, Ti, Hf, Zr, Mo and W, or combinations thereof, whose diffusion rate is slower than that of Al.

Wherein, the second work function regulating layer comprises Al or Al alloy, wherein the Al alloy is an alloy constituted by Al with a metal selected from Co, Ni, Cu, Pd, Pt, Ru, Re, Mo, Ta, Ti, Hf, Zr, W, Ir, Eu, Nd, Er and La, or combinations thereof.

Wherein the first work function regulating layer comprises: a) metal nitride in a form of $M_xN_y$ or $M_xSi_yN_z$, wherein M is one of Ta, Ti, Hf, Zr, Mo, and W, or combinations thereof; and/or b) metal, wherein the metal is one of Co, Ni, Cu, Pd, Pt, Ru, Re, Mo, Ta, Ti, Hf, Zr, W, Ir, Eu, Nd, Er and La, or combinations thereof.

Wherein the resistance regulating layer comprises: a) metal nitride in a form of $M_xN_y$ or $M_xSi_yN_z$, wherein M is one of Ta, Ti, Hf, Zr, Mo, and W, or combinations thereof; b) metal or metal alloy, including one of Co, Ni, Cu, Pd, Pt, Ru, Re, Mo, Ta, Ti, Hf, Zr, W, Ir, Eu, Nd, Er and La, or combinations thereof; c) metal silicide, including one of $CoSi_2$, $TiSi_2$, NiSi, PtSi, NiPtSi, CoGeSi, TiGeSi and NiGeSi, or combinations thereof; d) metal oxide conductor, including one of $In_2O_3$, $SnO_2$, ITO and IZO, or combinations thereof; and e) semiconductor materials, including one of doped polysilicon, amorphous silicon, polycrystalline germanium, and polycrystalline silicon-germanium, or combinations thereof.

In accordance with the semiconductor device and the method of manufacturing the same in the present invention, a PMOS work function regulating layer is deposited after a NMOS work function regulating layer is selectively deposited, thus the PMOS metal gate structure is simplified, the metal gate work function is effectively controlled while the filling space of the resistance regulating layer is increased, thereby the gate resistance is reduced effectively.

BRIEF DESCRIPTION OF THE DRAWINGS

The technical solutions of the present invention will be described in detail below with reference to the accompanying drawings.

DETAILED DESCRIPTION OF THE EMBODIMENTS

The features of the technical solutions of the present invention and the technical effects thereof are explained in detail in combination with the illustrative embodiments with reference to the drawings below, and disclosed herein a CMOS capable of controlling a metal gate work function effectively while reducing the gate resistance efficiently and a method of manufacturing the same. It shall be noted that like reference signs indicate like structures, and the terms like "first", "second", "on" and "below" etc. used in the present application may be used to modify various device structures or manufacturing processes. Unless specific explanations, such modifications do not imply the spatial, sequential or hierarchical relationships of the device structures or manufacturing processes.

The steps of the method for manufacturing a CMOS in accordance with the present invention will be described in detail with reference to the diagrammatic cross-sections in FIGS. 1-7, wherein the method is preferably adaptable to the gate-last process.

Figure 1:
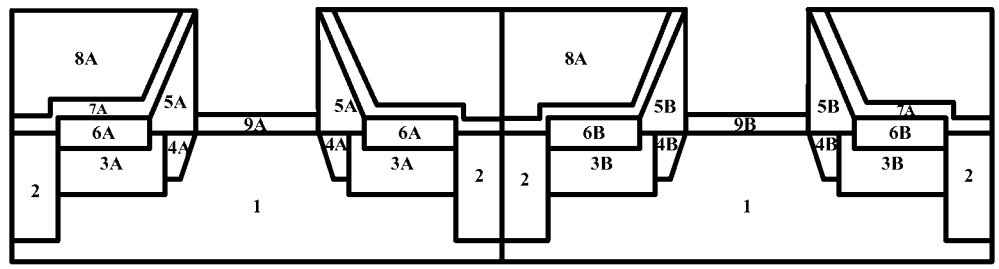
FIGS. 1 to 7 are diagrammatic cross-sections of a CMOS device, illustrating the different steps implemented in the method of manufacturing a CMOS in accordance with the aspects of the present invention.

Referring to FIG. 1, a CMOS basic structure is formed, that is, at least a first MOSFET and at least a second MOSFET are formed in the substrate comprising STIs, respectively. Wherein the first MOSFET comprises first source and drain regions, first source and drain extension regions, a first gate insulating layer, first gate spacers, first metal silicides, a first contact etch stop layer, and a first interlayer dielectric layer, and the second MOSFET comprises second source and drain regions, second source and drain extension regions, a second gate insulating layer, second gate spacers, second metal silicides, a first contact etch stop layer, and a first interlayer dielectric layer. The type of the first MOSFET is opposite to that of the second MOSFET, for example, if the first MOSFET is a PMOS, the second MOSFET is a NMOS; if the first MOSFET is a NMOS, the second MOSFET is a PMOS. Likewise, the definitions of the materials, structures or characteristics involving "first" and "second" can all be mutually exchanged.

Specifically, a substrate 1 is provided first. The substrate 1 shall be reasonably selected depending on the usage of the device and may comprise single crystalline bulk silicon (Si), silicon on insulator (SOI), single crystalline bulk germanium (Ge), germanium on insulator (GeOI), stained Si, SiGe, or compound semiconductor materials such as GaN, GaAs, InP, InSb, and C-based semiconductors such as graphene, SiC and carbon nanotube. As shown in FIG. 1, the substrate are of a block shape with the first MOSFET and the second MOSFET adjacently formed therein, but the two devices may also be separately formed, e.g., formed at well regions (not shown) of different conductivity types or formed with other separation electronic elements or structures located between them. In addition, the number of the first MOSFET and second MOSFET is not limited to one as shown in FIG. 1, a plurality of MOSFETs may be used depending on the CMOS circuit structure.

Preferably, shallow trench isolations (STIs) 2 are formed in the substrate 1. For example, photolithography/etching is performed firstly to form shallow trenches in the substrate 1, then an insulating isolation material is deposited by a conventional technique such as LPCVD and PECVD and planarized by chemical mechanical polishing (CMP) to expose the substrate 1, thereby forming STIs 2. Wherein the filling material for STIs 2 may be oxide, nitride, or oxynitride. As shown in the FIG., SITs 2 divide the enclosed substrate 1 into at least a first MOSFET active region and at least a second MOSFET active region, selective deposition and etching will be performed to the two regions in the following process to thereby form devices of different types.

Then, a pad oxide layer and a dummy gate layer are sequentially deposited on the surface of the entire wafer (i.e., the surface of the substrate 1 and STIs 2) and etched to form first and second dummy gate stack structures (not shown). The first and second dummy gate stack structures will be removed in the following process, so the pad oxide layer is preferably silicon oxide, and the dummy gate layer is preferably polysilicon, amorphous silicon or microcrystalline silicon, even silicon oxide. The width and thickness of the first and second dummy gate stack structures are set depending on the layout design rules for the PMOS and NMOS and the requirements of the device conductivity characteristics.

Then, first and second dummy spacers (not shown) are formed on both sides of the first and second dummy gate stack structures, respectively. For example, a spacer material layer formed of silicon oxide, silicon nitride, or a composite layer thereof is deposited on the device surface and then etched to form the dummy gate spacers.

Figure 2:
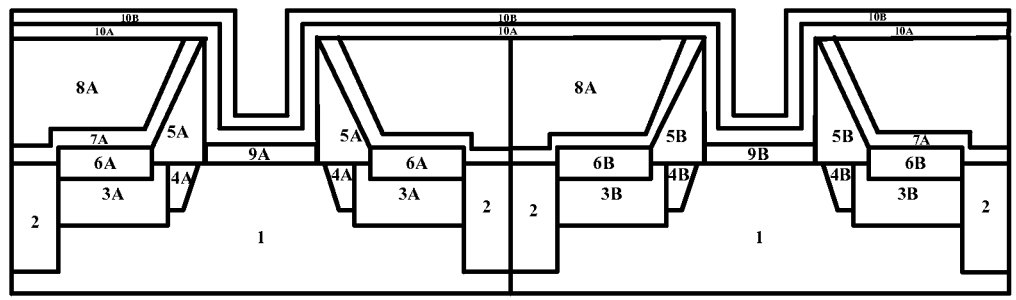

Next, in the first MOSFET active region and the second MOSFET active region, first source and drain regions 3A (of the first MOSFET) and second source and drain regions 3B (of the second MOSFET) are formed in the substrate 1 on both sides of the dummy gate spacers, respectively. Source and drain regions 3A/3B in traditional processes may be formed by respectively performing a first source and drain ion implantation to the substrate 1 using different masks so as to selectively implant doped ions of different conductivity types, e.g., to implant p-type impurities to the first MOSFET active region and to implant n-type impurities to the second MOSFET active region. In a preferred embodiment of the present invention, source and drain regions 3A/3B may be embedded strained source and drain regions, that is, the first MOSFET active region and second MOSFET region in the substrate 1 are etched by taking the first and second dummy gate spacers as masks respectively to form first and second source and drain grooves (not shown), then high stress materials such as SiGe or Si:C which are different from the material of the substrate 1 are selectively epitaxially grown in the first and second source and drain grooves, to thereby form embedded stained source and drain regions of the corresponding material. Wherein the upper surface of the embedded strained source and drain regions 3A/3B is not limited to be flush with that of the substrate 1 as shown in FIG. 2, but may be higher than the upper surface of the substrate 1 to form raised sources and drains. Preferably, doped ions may also be implanted to the embedded strained source and drain regions 3A/3B to regulate the type and concentration, or in-situ doping may be performed while the above embedded sources and drains are formed. If the first MOSFET corresponds to the PMOS, the source and drain regions 3A are embedded strained SiGe (e-SiGe) with boron, aluminum, gallium and indium etc. doped, and if the second MOSFET corresponds to the NMOS, then the source and drain regions 3B are embedded strained Si:C (e-SiC) with phosphorus, arsenic, and antimony etc. doped, and vice versa.

Afterwards, the first or second dummy gate spacers are respectively removed and first source and drain extension regions 4A or second source and drain extension regions 4B are formed in the substrate 1 on both sides of the first or second dummy gate stack structure, respectively. Dummy gate spacers formed of silicon nitride or silicon oxynitride may be removed by wet etching, then a second source and drain ion implantation is performed to form lightly doped (LDD) source and drain extension regions 4A/4B. Wherein the conductivity types of the source and drain extension regions 4A/4B are respectively the same as those of the source and drain regions 3A/3B, but the source and drain extensions regions 4A/4B have a lower doping concentration and a shallower junction depth.

Furthermore, the lightly doped source and drain extension regions 4A/4B and the heavily doped source and drain regions 3A/3B may be formed in an interchangeable order, that is, first performing a low energy and low dose implantation to form a lightly doped source and drain extension regions 4A/4B, then performing ion implantation, or after etching, epitaxially growing and performing in-situ doping to form a heavily doped source and drain regions 3A/3B.

Then, first gate spacer structures 5A and second gate spacer structures 5B are formed on both sides of the first and second dummy gate stack structures, respectively. The gate spacer structures 5A/5B may be made from conventional materials such as silicon oxide (SiOx), silicon nitride ($SiN_x$, x may be 1~2, and is not limited to an integer) and silicon oxynitride ($SiO_xN_y$, x and y may be reasonably adjusted depending on requirements), or combinations thereof. Or, preferably, the first and/or the second gate spacer structures 5A/5B may be at least two-layer laminated structure, e.g., a laminated layer (not shown) of a combination of a low stress material such as silicon oxide and silicon nitride and a high stress material such as diamond-like amorphous carbon (DLC), wherein said DLC high stress layer may apply a stress to the channel region closely, to increase the carrier mobility and thereby enhance the device driving capability. Preferably, a DLC layer is formed by a process such as PECVD and magnetron sputtering, and the process parameter is controlled such that the (absolute value of) stress is greater than 2 GPa, and preferably between 4~10 GPa.

Thereafter, a self-aligned silicide process is performed by respectively taking the first and second gate spacers 5A/5B as masks. A thin film of metal such as Pt, Co, Ni and Ti or metal alloy is deposited on the entire device surface, then a high temperature annealing process is performed such that the silicon contained in the embedded strained source and drain regions 3A/3B reacts with the metal to produce first/second source and drain contact metal silicides 6A/6B such as $CoSi_2$, $TiSi_2$, NiSi, PtSi, NiPtSi, CoGeSi, TiGeSi, and NiGeSi so as to decrease the source and drain contact resistance, thereby to further improve the device performance.

Upon formation of the source and drain contact metal silicides 6A/6B, deposition is performed on the entire device surface to form a first contact etch stop layer (CESL) 7A, that is, the CESL 7A is on the STIs 2, source and drain contact metal silicides 6A/6B, gate spacers 5A/5B, and dummy gate stack structures, the materials thereof may be a traditional high stress material of $SiO_x$ or $SiN_x$, or the aforesaid high stress DLC. The CESL 7A further improves the stress, thus further increase the stress in the channel region. Specifically, the so-called high stress of CESL 7A in the present invention is that the intrinsic stress of the material is greater than 1 GPa, preferably between 2~10 GPa.

A first interlayer dielectric layer (ILD) 8A is deposited for the gate-last process, the layer may be made from silicon oxide, phosphorosilicate glass, F-doped silicon oxide, C-doped silicon oxide, silicon nitride or low-K dielectric materials, or a multi-layer composite layer thereof; a process such as CMP and dry etching is used to planarize the ILD 8 such that its upper surface is flush with the top of the dummy gate stack structure.

The first and second dummy gate stack structures are removed by wet etching, leaving first and second gate trenches, as shown in FIG. 1. Then, silicon oxide, nitrogen-doped silicon oxide, silicon nitride, or other high-K materials are respectively deposited in the first and second gate trenches by a process such as PECVD, HDPCVD, or ALD, to form a first gate insulating layer 9A and a second gate insulating layer 9B. The gate insulating layers 9A/9B may only be located at the bottom of the gate trenches, or be located at the bottom and sidewall of the gate trenches. The high-K materials used for the gate insulating layers 9A/9B include but not limited to Hf-based materials selected from a group consisting of $HfO_2$, $HfSiO_x$, HfSiON, $HfAlO_x$, $HfTaO_x$, $HfLaO_x$, $HfAlSiO_x$, and $HfLaSiO_x$, rare-earth based high-K dielectric materials selected from a group consisting of $ZrO_2$, $La_2O_3$, $LaAlO_3$, $TiO_2$, and $Y_2O_3$, $Al_2O_3$, or a composite layer of the above materials. Preferably, there is an interface layer (not shown in layers) made from low-K materials between the gate insulating layers 9A/9B made from high-K materials and the substrate 1 to reduce the interface defects, the material thereof may be, e.g., one of silicon oxide, nitrogen-doped silicon oxide and silicon nitride, or combinations thereof.

So far, the basic structure as shown in FIG. 1 has already been formed, and the process steps of the present invention will be further described in detail below by referring to FIGS. 2-7.

Referring to FIG. 2, a first blocking layer and/or an etch stop layer 10A and a second work function regulating layer 10B are deposited on the first and second gate insulating layers 9A/9B in the first and second gate trenches by a conventional process such as PVD, CVD and ALD. The layer 10A is made of a material of MxNy or $M_xSi_yN_z$, wherein M is one of Ta, Ti, Hf, Zr, Mo and W or other element whose diffusion rate is slow (compared to Al), that is, the layer 10A does not contain Al. The layer 10A may be either a single layer (the first blocking layer or the etch stop layer) or a laminated layer of the first blocking layer and the etch stop layer. The layer 10A may preferably have a thickness of about 1~3 nm, so as to save the gate space as much as possible. The layer 10B contains materials having fast diffusion rate, e.g., may be Al-contained materials such as Al or Al alloy. The Al alloy may be the alloy of Al with other metal such as Co, Ni, Cu, Pd, Pt, Ru, Re, Mo, Ta, Ti, Hf, Zr, W, Ir, Eu, Nd, Er and La. The Al contained in the layer 10B will diffuse to the vicinity of the interface between the gate insulating layer 9B of the second MOSFET (e.g., NMOS) and the layer 10A, to thereby control the work function of the second MOSFET effectively.

Figure 3:
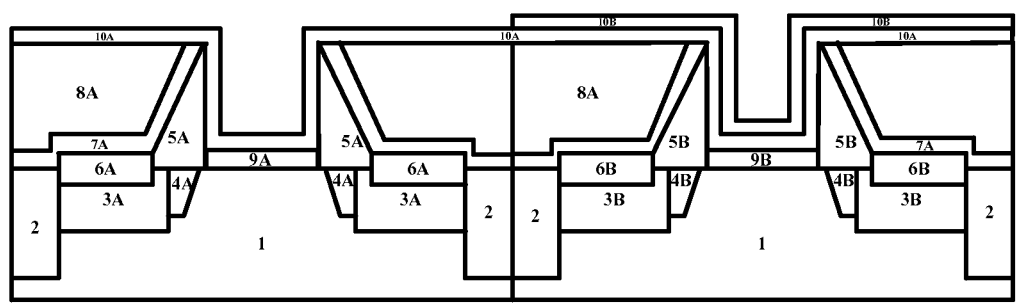

Referring to FIG. 3, the second work function regulating 10B on the first MOSFET is selectively etched to expose the first blocking layer and/or the etch stop layer 10A in the first gate trenches. For example, a hard mask or photoresist (not shown) is used to cover the second MOSFET, and then wet etching or dry etching is used to remove the second work function regulating layer 10B exposed on the first MOSFET, only leaving the second work function regulating layer 10B on the second MOSFET.

Figure 4:
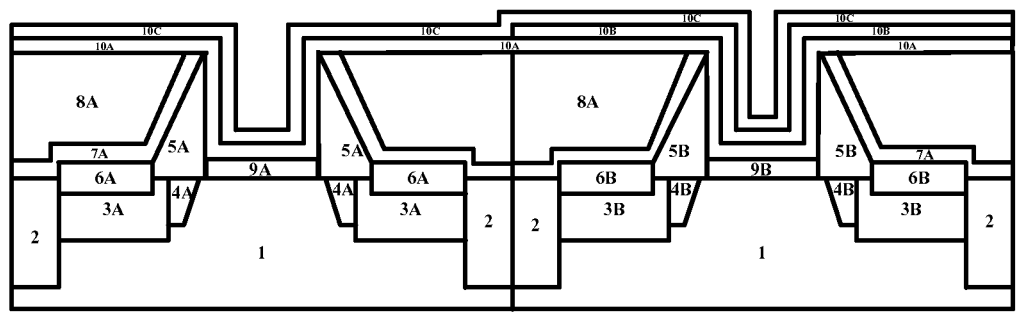

Referring to FIG. 4, a first work function regulating layer 10C is deposited on the entire device by a conventional process such as PVD, CVD and ALD, covering the first blocking layer/etch stop layer 10A in the first gate trenches in the first MOSFET region and the second work function regulating layer 10B in the second MOSFET region. The first work function regulating layer 10C is made of a material different from that of the second work function regulating layer 10B and does not contain fast diffusion ions (e.g., Al), hence the first work function regulating layer 10C may include: a) metal nitride, such as $M_xN_y$ and $M_xSi_yN_z$, wherein M is one of Ta, Ti, Hf, Zr, Mo and W, or combinations thereof (the mode of combination includes laminated multiple layers, or multielement metal nitride within a single layer); and/or b) metal, such as one of Co, Ni, Cu, Pd, Pt, Ru, Re, Mo, Ta, Ti, Hf, Zr, W, Ir, Eu, Nd, Er, and La, or combinations thereof (the mode of combination includes alloy). Since the first work function regulating layer 10C does not contain fast diffusion ions such as Al, the layer has less influence upon the second work function regulating layer 10B in contact with and directly below it in the second MOSFET region, thus the extra blocking layer mentioned in the part of background art may be omitted. Thereby, the complexity of the gate structure may be reduced, which is advantageous for fine processing and improving the subsequent filling of the resistance regulating layer.

Figure 5:
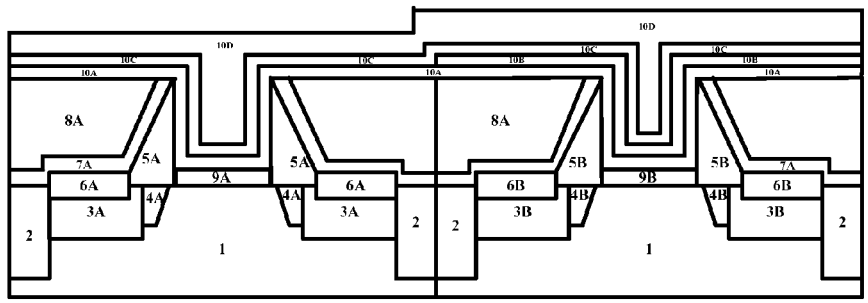

Referring to FIG. 5, a resistance regulating layer 10D is deposited on the entire device by a conventional process such as PVD, CVD and ALD, fully filling the first gate trenches and the second gate trenches, and covering the first work function regulating layer 10C. The resistance regulating layer 10D may include: a) metal nitride, such as $M_xN_y$ and $M_xSi_yN_z$, wherein M is one of Ta, Ti, Hf, Zr, Mo and W, or combinations thereof; b) metal or metal alloy, such as one of Co, Ni, Cu, Pd, Pt, Ru, Re, Mo, Ta, Ti, Hf, Zr, W, Ir, Eu, Nd, Er, and La, or combinations thereof; c) metal silicide, such as $CoSi_2$, $TiSi_2$, NiSi, PtSi, NiPtSi, CoGeSi, TiGeSi and NiGeSi, or combinations thereof; d) metal oxide conductor, such as $In_2O_3$, $SnO_2$, ITO and IZO, or combinations thereof; e) semiconductor materials, such as doped polysilicon, amorphous silicon, polycrystalline germanium and polycrystalline silicon-germanium, or combinations thereof. Preferably, high-temperature fast annealing, e.g., including laser annealing and spike annealing, is preferably performed on the entire device surface to improve or change the stress. Preferably, the stress of the resistance regulating layer 10D is made to be greater than 2 GPa.

Figure 6:
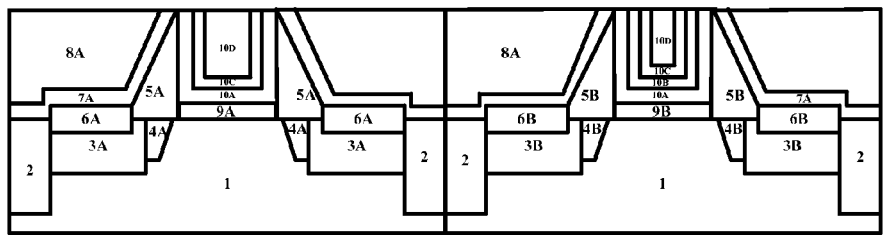

Referring to FIG. 6, the resistance regulating layer 10D, the first work function regulating layer 10C, the second work function regulating layer 10B and the first blocking layer 10A in the first MOSFET and the second MOSFET are planarized by a process such as CMP to expose the interlayer dielectric layer ILD 8A.

Figure 7:
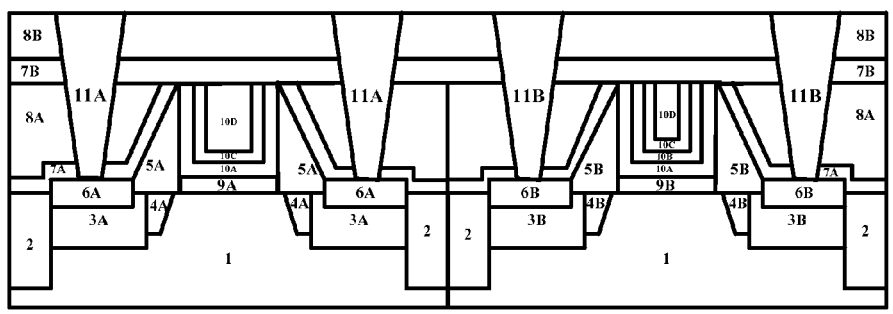

Referring to FIG. 7, device manufacturing is completed. A second contact etch stop layer (CESL) 7B and a second interlayer dielectric (ILD) layer 8B are deposited on the surface of the entire device and are planarized by CMP. The second ILD 8B, the second CESL 7B, the first ILD 8A and the first CESL 7A are etched to form source and drain contact holes so as to expose first and second source and drain contact metal silicides 6A/6B. A contact metal is deposited to form first and second source and drain metal plugs 11A/11B and planarization is performed by CMP to expose the second ILD 8B.

The structure of the finally formed semiconductor device is as shown in FIG. 7, comprising a substrate 1, STIs 2, at least a first MOSFET and at least a second MOSFET, wherein the first MOSFET comprises first source and drain regions 3A in the substrate 1, first source and drain extension regions 4A at the inner side of the first source and drain regions 3A, first gate spacers 5A on the first source and drain extension regions 4A, first source and drain contact metal silicides 6A on the first source and drain regions 3A, a first gate stack structure between the first gate spacers 5A on the substrate 1, first and second contact etch stop layers 7A/7B, first and second interlayer dielectric layers 8A/8B, and first source and drain metal plugs 11A passing though the first and second interlayer dielectric layers 8A/8B to be in contact with the source and drain contact metal silicides 6A, the first contact etch stop layer 7A being located on the first source and drain contact metal silicides 6A, first gate spacers 5A, and the first gate stack structure, wherein the first gate stack structure sequentially comprises a first gate insulating layer 9A, a first blocking layer 10A, a first work function regulating layer 10C, and a resistance regulating layer 10D; wherein the second MOSFET comprises second source and drain regions 3B in the substrate 1, second source and drain extension regions 4B at the inner side of the second source and drain regions 3B, second gate spacers 5B on the second source and drain extension regions 4B, second source and drain contact metal silicides 6B on the second source and drain regions 3B, a second gate stack structure between the second gate spacers 5B on the substrate 1, contact etch stop layers 7A/7B, interlayer dielectric layers 8A/8B, and second source and drain metal plugs 11B passing though the interlayer dielectric layers to be in contact with the source and drain contact metal silicides 6B, the contact etch stop layer 7A being located on the second source and drain contact metal silicides 6B, second gate spacers 5B, and the second gate stack structure, wherein the second gate stack structure sequentially comprises a second gate insulating layer 9B, a first blocking layer 10A, a second work function regulating layer 10B, a first work function regulating layer 10C and a resistance regulating layer 10D. Wherein the specific materials and methods for forming the above layers have been described in detailed in the above manufacturing method, no more unnecessary details will be provided here.

In addition, although the present invention only contain schematic diagrams of an MOSFET having planar channel in the drawings, it will be appreciated by a person skilled in the art that the MOSFET structure of the present invention may also be applied to device structures such as 3D multigates, vertical channel, and nanowire.

In accordance with the semiconductor device and the method of manufacturing the same in the present invention, a PMOS work function regulating layer is deposited after a NMOS work function regulating layer is selectively deposited, thus the PMOS metal gate structure is simplified, the metal gate work function is effectively controlled while the filling space of the resistance regulating layer is increased, thereby the gate resistance is reduced effectively.

Although the present invention has been described with reference to one or more illustrative embodiments, it may be appreciated by a person skilled in the art that various appropriate modifications and equivalents can be made to the device structure without departing from the scope of the present invention. Besides, many modifications adaptable to specific situations or materials can be made under the disclosed teaching without departing from the scope of the present invention. Therefore, it is not intended to limit the present invention to the specific embodiments which are disclosed as the preferred embodiments for implementing the present invention, the disclosed device structure and the manufacturing method thereof will include all the embodiments that fall within the scope of the present invention.

What is claimed is:

1. A method for manufacturing a semiconductor device, comprising the steps of:
    forming a plurality of source and drain regions in a substrate;
    forming a plurality of gate spacer structures and an interlayer dielectric layer around the gate spacer structures on the substrate, wherein the gate spacer structures enclose a plurality of first gate trenches and a plurality of second gate trenches;
    depositing sequentially a first gate insulating layer and a second gate insulating layer, a first blocking layer and a second work function regulating layer in the first and second gate trenches;
    performing selective etching to remove the second work function regulating layer from the first gate trenches to expose the first blocking layer;
    depositing a first work function regulating layer on the first blocking layer in the first gate trenches and on the second work function regulating layer in the second gate trenches; and
    depositing a resistance regulating layer on the first work function regulating layer in the first gate trenches and on the first work function regulating layer in the second gate trenches.

2. The method for manufacturing a semiconductor device according to claim 1, wherein the first and/or the second gate insulating layer comprises one of silicon oxide, nitrogen-doped silicon oxide, silicon nitride, and high-K materials, or combinations thereof.

3. The method for manufacturing a semiconductor device according to claim 2, wherein the high-K materials include Hf-based materials selected from a group consisting of $HfO_2$, $HfSiO_x$, HfSiON, $HfAlO_x$, $HfTaO_x$, $HfLaO_x$, $HfAlSiO_x$, and HfLaSiO$_x$, rare-earth based high-K dielectric materials selected from a group consisting of ZrO$_2$, La$_2$O$_3$, LaAlO$_3$, TiO$_2$ and Y$_2$O$_3$, Al$_2$O$_3$, or a composite layer of the above materials.

4. The method for manufacturing a semiconductor device according to claim 1, wherein the first blocking layer comprises M$_x$N$_y$ or M$_x$Si$_y$N$_z$, wherein M is a metal selected from Ta, Ti, Hf, Zr, Mo and W, or combinations thereof, whose diffusion rate is slower than that of Al.

5. The method for manufacturing a semiconductor device according to claim 1, wherein the second work function regulating layer comprises Al or Al alloy, wherein the Al alloy is an alloy constituted by Al with a metal selected from Co, Ni, Cu, Pd, Pt, Ru, Re, Mo, Ta, Ti, Hf, Zr, W, Ir, Eu, Nd, Er and La, or combinations thereof.

6. The method for manufacturing a semiconductor device according to claim 1, wherein the first work function regulating layer comprises: a) metal nitride in a form of M$_x$N$_y$ or M$_x$Si$_y$N$_z$, wherein M is one of Ta, Ti, Hf, Zr, Mo, and W, or combinations thereof; and/or b) metal, wherein the metal is one of Co, Ni, Cu, Pd, Pt, Ru, Re, Mo, Ta, Ti, Hf, Zr, W, Ir, Eu, Nd, Er and La, or combinations thereof.

7. The method for manufacturing a semiconductor device according to claim 1, wherein the resistance regulating layer comprises: a) metal nitride in a form of M$_x$N$_y$ or M$_x$Si$_y$N$_z$, wherein M is one of Ta, Ti, Hf, Zr, Mo, and W, or combinations thereof; b) metal or metal alloy, including one of Co, Ni, Cu, Pd, Pt, Ru, Re, Mo, Ta, Ti, Hf, Zr, W, Ir, Eu, Nd, Er and La, or combinations thereof; c) metal silicide, including one of CoSi$_2$, TiSi$_2$, NiSi, PtSi, NiPtSi, CoGeSi, TiGeSi and NiGeSi, or combinations thereof; d) metal oxide conductor, including one of In$_2$O$_3$, SnO$_2$, ITO and IZO, or combinations thereof; and e) semiconductor materials, including one of doped polysilicon, amorphous silicon, polycrystalline germanium, and polycrystalline silicon-germanium, or combinations thereof.

* * * * *